United States Patent
Mordkovich

(10) Patent No.: US 6,424,241 B2
(45) Date of Patent: Jul. 23, 2002

(54) FINE TUNING SYSTEM FOR VOLTAGE CONTROLLED OSCILLATORS

(75) Inventor: Mikhail Mordkovich, Brooklyn, NY (US)

(73) Assignee: Scientific Components, Brooklyn, NY (US)

( * ) Notice: Subject to any disclaimer, the term of this patent is extended or adjusted under 35 U.S.C. 154(b) by 0 days.

(21) Appl. No.: 09/814,679

(22) Filed: Mar. 22, 2001

Related U.S. Application Data
(60) Provisional application No. 60/222,964, filed on Aug. 4, 2000.

(51) Int. Cl.[7] ................................. H03B 5/18
(52) U.S. Cl. ................. 333/235; 331/107 SL
(58) Field of Search ................. 333/235, 238, 333/205, 17.1; 331/107

(56) References Cited

U.S. PATENT DOCUMENTS

| | | | |
|---|---|---|---|
| 4,288,530 A | * | 9/1981 | Bedard et al. ............... 430/315 |
| 5,187,451 A | * | 2/1993 | Nakamoto et al. ............ 331/99 |
| 5,457,431 A | * | 10/1995 | Fuentes et al. ............ 331/107 |
| 5,805,026 A | * | 9/1998 | Kuroda et al. ................ 331/96 |

FOREIGN PATENT DOCUMENTS

| | | | | |
|---|---|---|---|---|
| JP | 02-211704 | * | 8/1990 | ............ H03B/5/18 |
| JP | 04-358408 | * | 12/1992 | ............ H03B/5/18 |

* cited by examiner

*Primary Examiner*—Robert Pascal
*Assistant Examiner*—Dean Takaoka
(74) *Attorney, Agent, or Firm*—Kevin Redmond

(57) ABSTRACT

A fine tuning system for adjusting the frequency of voltage controlled oscillators with fine resolution by mechanical tuning. A resonator is located on the dielectric substrate resonant frequency. The tuning system has metal strip located on a dielectric substrate. The metal strip has a pair of edges and a primary cut extending into the metal strip. The primary cut has a pair of ends. Several cavities in the metal strip are located adjacent an end of the primary cut. An elongated slot is cut into the metal strip. The slot is located between the cavities and an edge. The slot reduces the coupling of the tuning elements such as shorts, formed by cavities, to the resonator, and therefore allows fine tuning of the resonant frequency. Location of the slot closer to the cavities results in more fine tuning. Location of the slot further away from the cavities results in coarse tuning. An alternative embodiment is shown.

18 Claims, 5 Drawing Sheets

FINE TUNING SYSTEM FOR VOLTAGE CONTROLLED OSCILLATORS

This application claims priority from Provisional application Ser. No. 60/222,964, filed Aug. 4, 2000.

BACKGROUND OF THE INVENTION

1. Field of the Invention

The present invention relates generally to voltage controlled oscillators used in communication devices and, in particular, to adjusting the frequency of the voltage controlled oscillator by mechanical tuning.

2. Description of the Related Art

RF communication devices, such as microwave transmitters and receivers, require a stable operating frequency provided by an oscillator. Typically, the operating frequency is generated by a voltage controlled oscillator (VCO). The operating frequency of the voltage controlled oscillator is dependent on parts tolerances and manufacturing techniques. A circuit board in the oscillator is used to define a microstrip resonator. Etching variations during manufacturing of the microstrip lines on the circuit board can cause large shifts in the output frequency of the oscillator. Microstrip lines are also used in filters and the same etching variations can cause changes in the filter bandpass or attenuation frequencies Prior art methods to adjust the operating frequency of VCOs have included using variable capacitors and variable inductors. These methods add cost to the oscillator and have the disadvantage of potentially changing values over time. Another prior art method to adjust the operating frequency of VCOs is to use cutting techniques to remove conductive material from circuit lines This is illustrated by FIG. 1. A conventional microstrip resonator 10 is shown in FIG. 1. Resonator 10 is part of a conventional voltage controlled oscillator circuit It consists of a metal strip 12 on a dielectric substrate or printed circuit board 14. The metal strip 12 is typically etched copper and the circuit board 14 is a typically a laminate of epoxy and fiberglass called FR4. Metal strip 12 has edges 12A and 12B. The microstrip resonator of FIG. 1 is shorted to ground G along edge 12B. The microstrip resonator 10 has an external capacitance C that is part of the oscillator circuit connected to the resonator. A primary cut 20 is shown extending into metal strip 12. The primary cut has ends 20A and 20B. Several cavities 16 are located between primary cut end 20B and end 15 of the metal strip. In between cavities 16 are located shorting lines 18. The length of the primary cut 20 is adjusted by removing additional shorting lines 18 resulting in a longer primary cut. This changes the point of grounding of the resonator and as such changes its equivalent inductance. Every cut increases the effective electrical length and causes a shift in the resonant frequency down or shifts the equivalent circuit inductance higher.

The cutting action can be provided by laser trimming, sand blasting through a mask or mechanically by using a rotating tool. Unfortunately, the technique shown in FIG. 1 has a major drawback. The cutting of additional shorting lines results in large jumps or shifts in frequency of the oscillator with every shorting line 18 that is cut. In some applications, it is required to precisely set the resonant frequency The shorting lines cannot be moved to close to each other because it becomes difficult to accurately cut the shorting lines.

There is a current unmet need for a fine tuning system for VCOs that is permanent and can easily be performed during testing of the VCO. In addition, there is a need for a mechanical fine tuning system for VCOs that causes small changes in operating frequency with a change in the mechanical structure of the circuit board and does not require additional circuit board space.

SUMMARY OF THE INVENTION

The present invention provides a fine tuning system for voltage controlled oscillators used in communication devices and, in particular, to adjusting the frequency of the voltage controlled oscillator with fine resolution by mechanical tuning.

The present invention provides a fine tuning apparatus for a resonator. The resonator has a resonant frequency. The apparatus includes a metal strip located on a dielectric substrate. The metal strip has edges. A primary cut extends into the metal strip. The primary cut has a pair of ends. Several cavities in the metal strip are located adjacent an end of the primary cut. An elongated slot is cut into the metal strip. The slot is located between the cavities and an edge. The slot changes the resonant frequency of the resonator in fine increments in proportion to the length of the slot. The fine tuning apparatus does not increase the size of the metal strip.

A further embodiment of the present invention provides a fine tuning apparatus for a resonator. The resonator has a resonant frequency. The apparatus includes a metal strip located on a dielectric substrate. The metal strip has a pair of edges. A primary cut extends into the metal strip. The primary cut has a pair of ends. A first set of cavities in the metal strip is located adjacent an end of the primary cut. A second set of cavities in the metal strip is located between the first set of cavities and an edge of the metal strip. A first set of shorting lines is located between the first set of cavities. The first set of shorting lines, when cut, causes a coarse adjustment to the resonant frequency of the resonator in proportion to the number of the first set of shorting lines cut. A second set of shorting lines is located between the second set of cavities. The second set of shorting lines, when cut, causes a fine adjustment to the resonant frequency of the resonator in proportion to the number of the second set of shorting lines cut. The fine tuning apparatus does not increase the size of the metal strip.

DETAILED DESCRIPTION OF THE INVENTION

Figure 1:
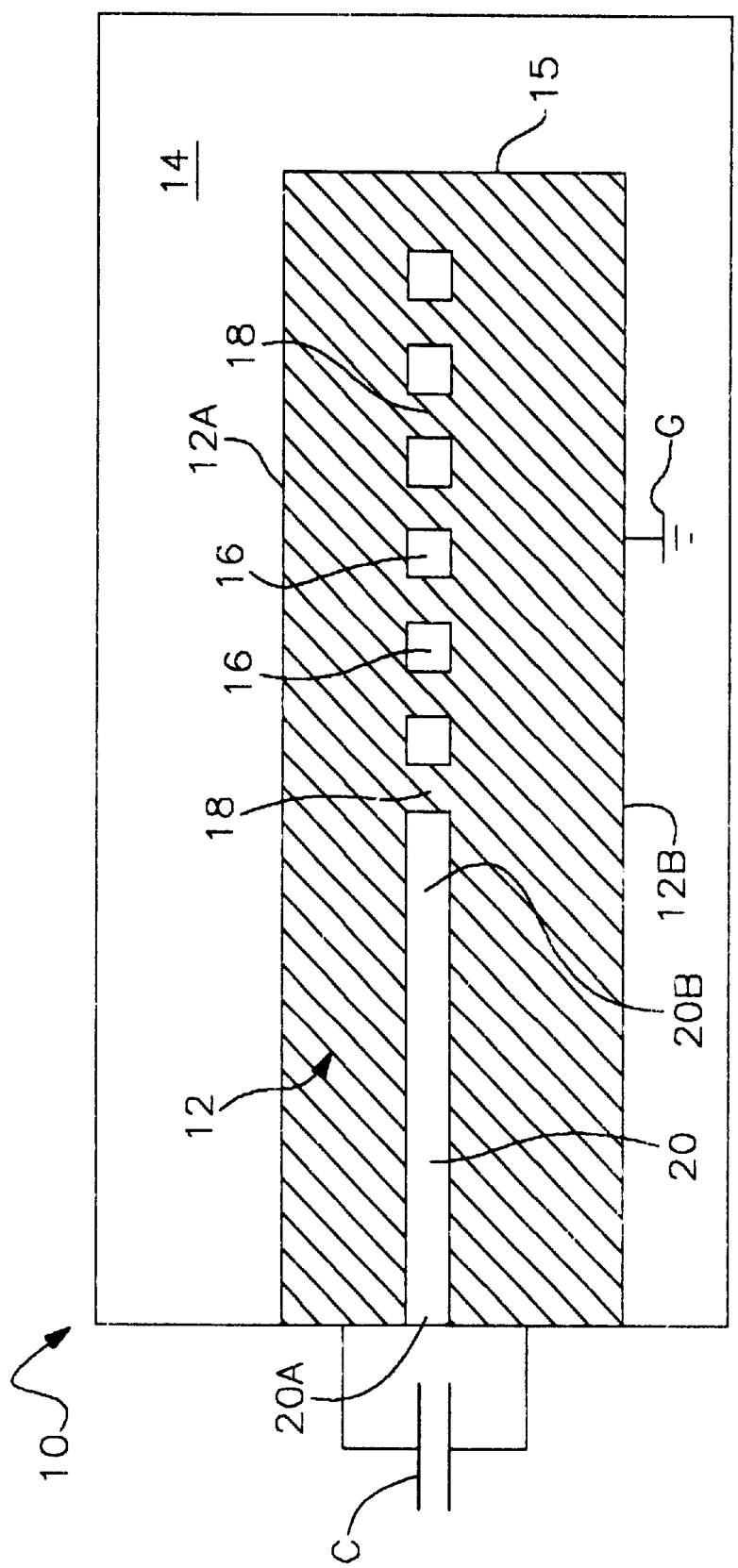
FIG. 1 is a top view of a prior art microstrip resonator.
Figure 2:
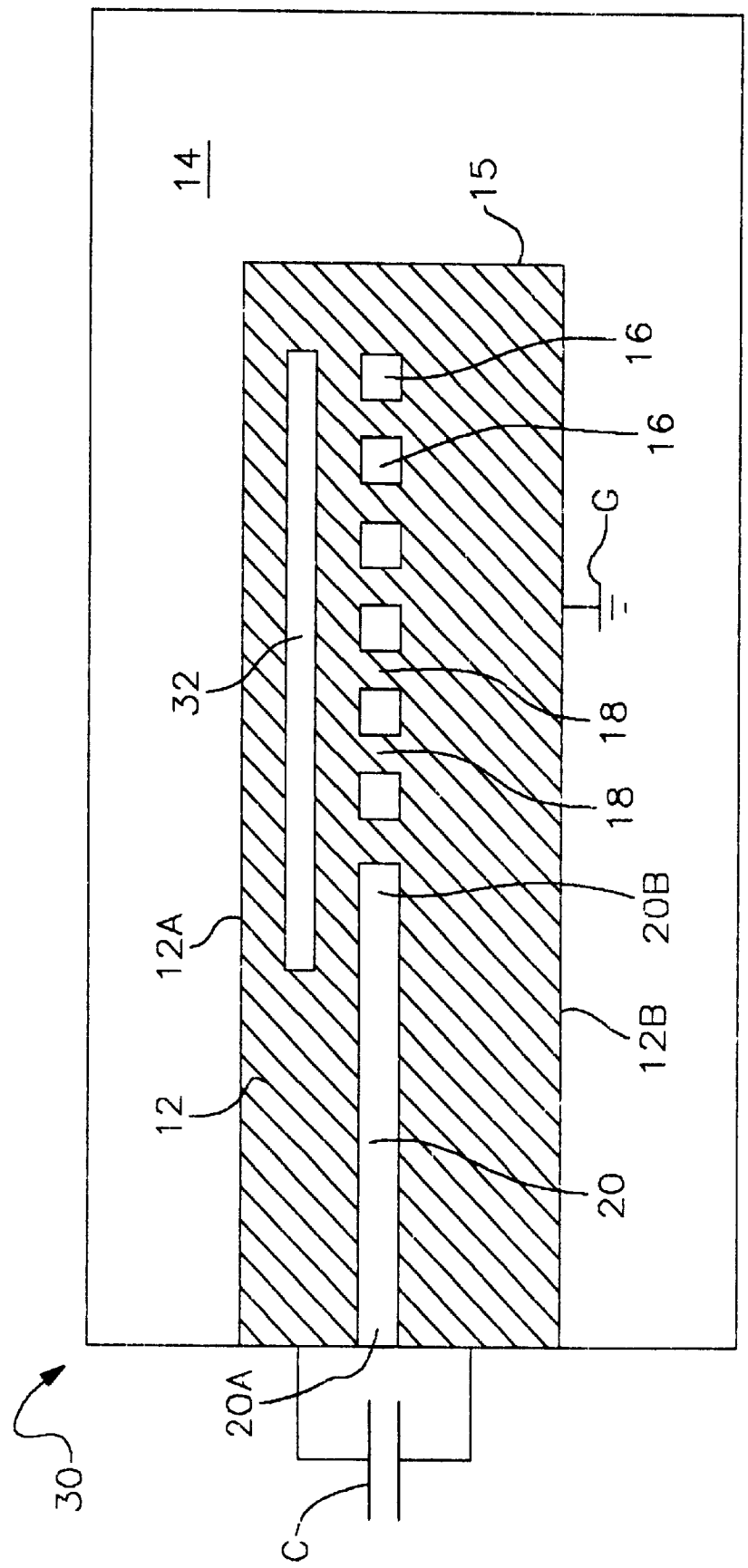
FIG. 2 is a top view of a first embodiment of a microstrip resonator with fine tuning.

Referring to FIG. 2, a top view of a first embodiment of a micro strip resonator with fine tuning 30 is shown. Resonator 30 is part of a conventional voltage controlled oscillator circuit. A metal strip 12 is located on a dielectric substrate or printed circuit board 14. It is understood that typically the substrate is larger than shown and would contain additional circuit components that are not shown. The metal strip 12 is typically etched copper and the circuit board 14 is typically a laminate of epoxy and fiberglass called FR4. Metal strip 12 has edges 12A and 12B. Resonator 30 is shorted to ground G along edge 12B of the metal strip 15 The microstrip resonator 30 has an external capacitance C that is part of the oscillator circuit connected to the resonator. The primary cut 20 is shown extending into metal strip 12 The primary cut has ends 20A and 20B. Several cavities 16 are located between primary cut end 20B and end 15 of the metal strip. In between cavities 16 are located shorting lines 18. The length of the primary cut 20 is adjusted by removing additional shorting lines 18 resulting in a longer primary cut. This changes the point of grounding of the resonator and as such changes its equivalent inductance. Every cut increases the effective electrical length and causes a coarse adjustment or large shift in the resonant frequency down or shifts the equivalent circuit inductance higher.

A rectangular slot 32 in the metal strip 12 is located between cavities 16 and edge 12A. The slot is generally very narrow compared to the width of line 12 and is normally placed close to the cavities 16. The length of the slot 32 that is cut into the metal strip 12 determines the amount of fine adjustment or change in the resonant frequency of the resonator. The slot 32 transforms the previous single resonator into two not necessarily equal resonators or inductors L1 and L2.

A comparison of the prior art and the resonator design of FIG. 2 shows the effect of the slot 32 on the inductance step change. Assume that the prior art resonator has N shorting lines 18 or N steps of tuning, an effective inductance value of Lorig and a step change in inductance value of ΔLorig. The ΔLorig is proportional to Zorig which is proportional to L/Worig.

For the resonator 30 of FIG. 2, the total inductance is:

$$Lt = (L1 \times L2)/(L1+L2)$$

The value of the total; inductance Lt will be slightly more than the original inductance Lorig, because the slot 32 will decrease the effective resonator width. In the new resonator 30, the tuning only effects inductor L2. The change in inductance for resonator 30 is $$\Delta Lt = [(L1 \times \Delta L2 + L2 \times \Delta L1) \times (L1+L2) - (\Delta L2 + \Delta L1) \times (L1 \times L2)]/(L1+L2)^2$$

In this particular case ΔL1=0

$$\Delta Lt = [(L1 \times \Delta L2) \times (L1+L2) - \Delta L2 \times (L1 \times L2)]/(L1+L2)^2 = \Delta L2 \times (L1 \times L1)/(L1+L2)^2 \quad \Delta Lt = \Delta L2/(1+L2/L1)^2$$

Therefore, even if the step size ΔL2 is equal to ΔL, the resonator 30 of FIG. 2 allows a reduction in the amount of the inductance change or step and also a reduction in the amount of frequency change or step. As an example, if the slot 32 is located in the center of the metal strip, then L1 is greater than L2 and ΔLt~ΔL2. As more metal strips 18 are cut, L1 and L2 will be approximately equal and ΔLt~ΔL2/4. Here the structure of resonator 30 is implemented without the use of additional circuit board space. The fine tuning structure is able to be designed into the existing design of the metal strip 12 without changing dimensions. By positioning the slot 32 toward cavities 16, L2 becomes larger than L1 and ΔLt becomes smaller. Hence the fine tuning step is controllable according to the need.

Figure 3:
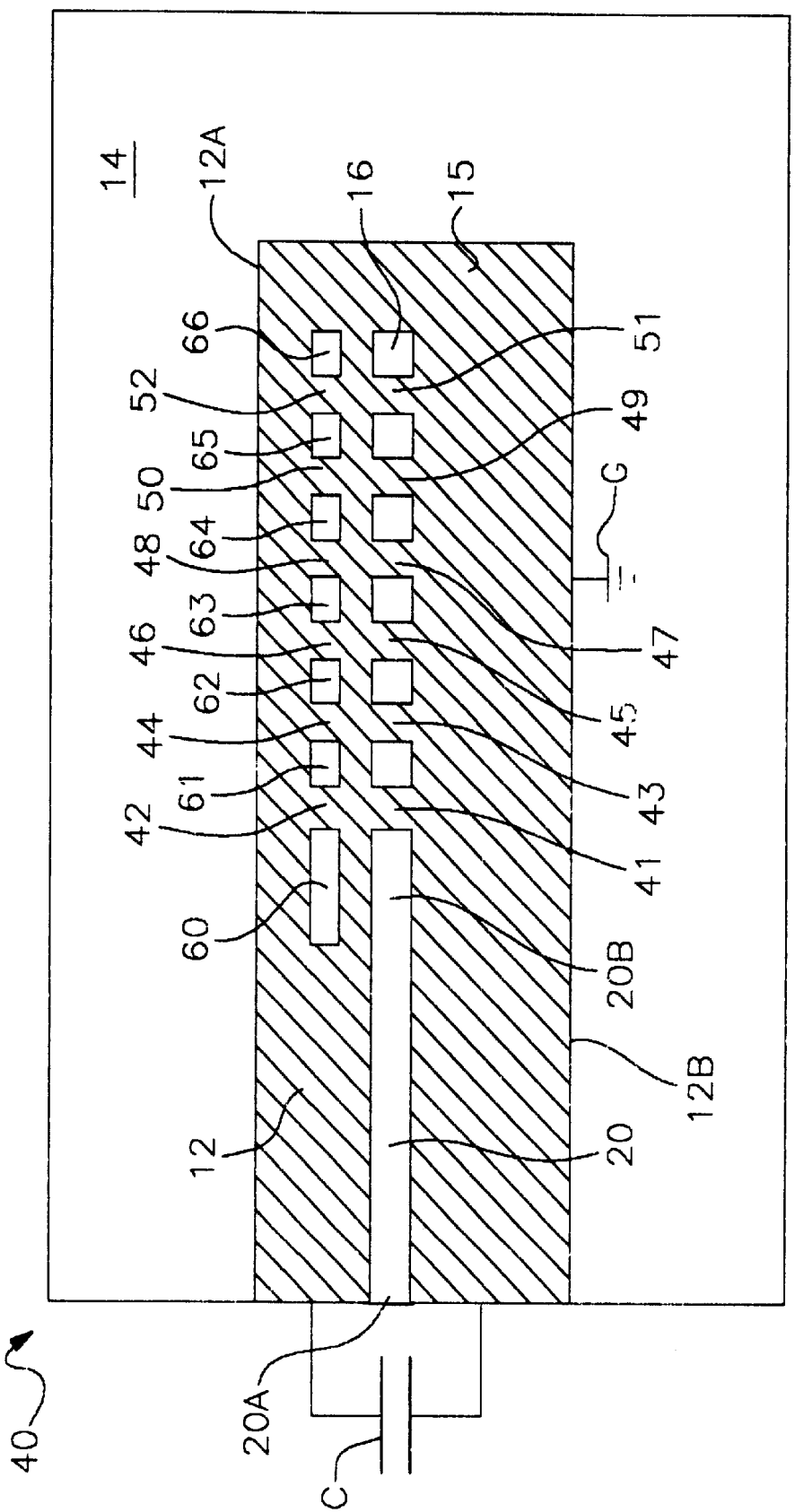
FIG. 3 is a top view of another embodiment of a microstrip resonator with fine tuning.
Figure 4:
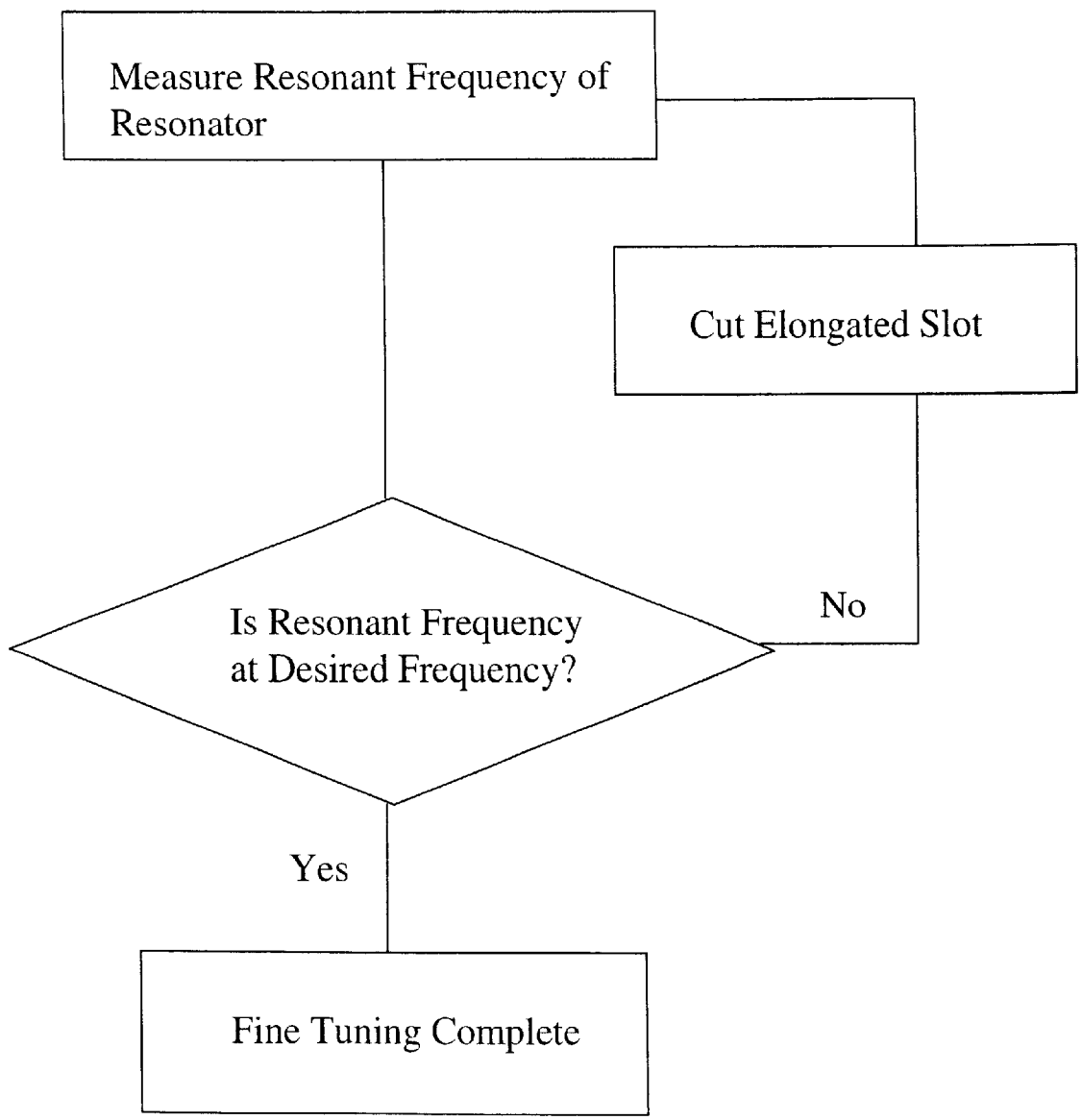
FIG. 4 is a flow chart of a method for fine tuning a resonator.
Figure 5:
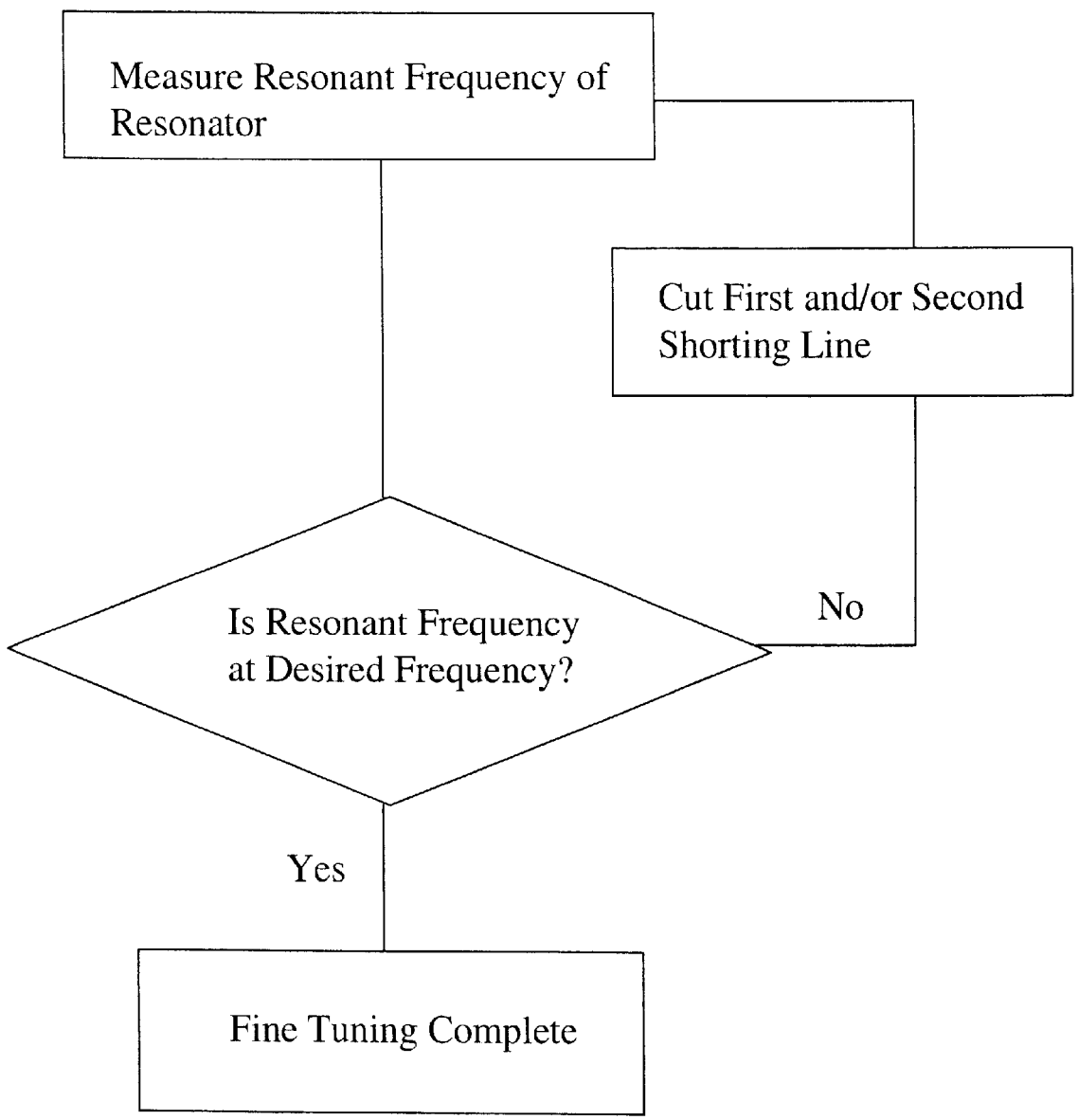
FIG. 5 is a flow chart of an alternative method for fine tuning a resonator.

Referring to FIG. 3, a top view of another embodiment of a microstrip resonator with fine tuning 40 is shown. Resonator 40 is part of a conventional voltage controlled oscillator circuit. Resonator 40 has shorting lines 41, 43, 45, 47, 49 and 51 located between cavities 16. Shorting lines 42, 44, 46, 48, 50 and 52 are located between cavities 60, 61, 62, 63, 64, 65 and 66. Shorting lines 42–52 and cavities 60–66 are located between cavities 16 and edge 12A. Cavities 16 and 60–66 are preferably chemically etched out of metal strip 12 during manufacturing of the substrate or circuit board 14.

In resonator 40, even numbered shorting lines 42, 44, 46, 48, 50 or 52 are preferably mechanically cut to provide for fine tuning of the resonator. However, they could also be removed by a laser or by sand blasting through a mask. If the even numbered shorting lines 42–52 are uncut, then resonator 40 is similar to resonator 10 in frequency and equivalent inductance step change. Odd numbered shorting lines 41–51 can then be cut resulting in a rough change or step in resonant frequency of resonator 40.

Cutting or removing the even numbered shorting lines 42–52, will result in resonator 40 performing similar to that of resonator 30 in frequency and equivalent inductance step change. The even numbered shorting lines allow for fine tuning together on the same resonator structure. The fine tuning structure of resonator 40 is implemented without the use of additional circuit board space. The fine tuning structure is able to be designed into the existing design of the metal strip 12 without changing dimensions.

The illustrated embodiment showed the fine tuning system used in a voltage controlled oscillator. It is possible to use the fine tuning system for other devices such as filters, mixers and amplifiers.

The shape of the slot 32 and cavities 60–66 shown was rectangular. Other shapes for slot 32 and cavities 60–66 would also perform the same function. For example, slot 32 and cavities 60–66 could be oval, trapezoidal, square, circular, or other shapes.

While the invention has been taught with specific reference to these embodiments, someone skilled in the art will recognize that changes can be made in form and detail without departing from the spirit and the scope of the invention. The described embodiments are to be considered in all respects only as illustrative and not restrictive.

What I claim as my invention is all of the objects of the summary section.

What is claimed is:

1. A fine tuning apparatus for a resonator, the resonator having a resonant frequency, the apparatus comprising:
   (a) a metal strip located on a dielectric substrate, the metal strip having a first and a second edge;
   (b) a primary cut that extends into the metal strip between the first and second edges, the primary cut having an end;
   (c) a plurality of cavities that are located in the metal strip adjacent the end of the primary cut;
   (d) a plurality of shorting lines located between each of the cavities; and
   (e) an elongated slot cut into the metal strip parallel to the primary cut, the slot located between the cavities and the first edge, the slot changing the resonant frequency of the resonator in fine increments in proportion to the length of the slot.

2. The fine tuning apparatus according to claim 1, wherein the fine tuning apparatus does not increase the size of the metal strip.

3. The fine tuning apparatus according to claim 1, wherein the elongated slot changes the capacitance of the metal strip.

4. The fine tuning apparatus according to claim 1, wherein the dielectric substrate is a printed circuit board.

5. The fine tuning apparatus according to claim 1, wherein the elongated slot is formed by mechanical cutting.

6. The fine tuning apparatus according to claim 1, wherein the elongated slot is formed by a laser.

7. A fine tuning apparatus for a resonator, the resonator having a resonant frequency, the apparatus comprising:
   (a) a metal strip located on a dielectric substrate, the metal strip having a first and a second edge;
   (b) a primary cut that extends into the metal strip between the first and second edges, the primary cut having an end;
   (c) a first set of cavities located in the metal strip adjacent the end of the primary cut;
   (d) a second set of cavities located in the metal strip between the first set of cavities and the first edge of the metal strip;
   (e) a first set of shorting lines located between the first set of cavities, the first set of shorting lines, when cut, causing a coarse adjustment to the resonant frequency of the resonator in proportion to the number of the first set of shorting lines cut; and
   (f) a second set of shorting lines located between the second set of cavities; the second set of shorting lines, when cut, causing a fine adjustment to the resonant frequency of the resonator in proportion to the number of the second set of shorting lines cut.

8. The fine tuning apparatus according to claim 7, wherein the resonator is coupled to a voltage controlled oscillator.

9. The fine tuning apparatus according to claim 7, wherein the fine tuning apparatus does not increase the size of the metal strip.

10. The fine tuning apparatus according to claim 7, wherein the dielectric substrate is a printed circuit board.

11. The fine tuning apparatus according to claim 7, wherein the first and second sets of shorting lines are cut by mechanical cutting.

12. The fine tuning apparatus according to claim 7, wherein the first and second sets of shorting lines are cut by a laser.

13. A method for fine tuning a resonator so as to change a resonant frequency produced by the resonator, comprising the steps of:
   (a) providing a metal strip located on a dielectric substrate, the metal strip having a first and a second edge, a primary cut that extends into the metal strip between the first and second edges, the primary cut having an end and a plurality of cavities that are located in the metal strip adjacent the end of the primary cut;
   (b) measuring the resonant frequency of the resonator;
   (c) cutting an elongated slot cut into the metal strip, the slot located between the cavities and the first edge, the slot being parallel to the primary cut, the slot changing the resonant frequency of the resonator in fine increments in proportion to the length of the slot; and
   (d) measuring a new resonant frequency of the resonator.

14. The method for fine tuning a resonator according to claim 13, wherein steps b, c and d are automated.

15. The method for fine tuning a resonator according to claim 13, wherein steps c and d are repeated until a desired resonant frequency is produced.

16. A method for fine tuning a resonator so as to change a resonant frequency produced by the resonator, comprising the steps of:
   (a) providing a metal strip located on a dielectric substrate, the metal strip having a first and second edge and a primary cut that extends into the metal strip, the primary cut having an end, further providing a first set of cavities that are located in the metal strip adjacent the end of the primary cut and a second set of cavities that are located in the metal strip between the first set of cavities and the first edge of the metal strip;
   (b) providing a first set of shorting lines, located between the first set of cavities and a second set of shorting lines located between the second set of cavities;
   (c) measuring the resonant frequency of the resonator;
   (d) cutting the first set of shorting lines so as to cause a coarse adjustment to the resonant frequency of the resonator in proportion to the number of the first set of shorting lines cut;
   (e) cutting the second set of shorting lines so as to cause a fine adjustment to the resonant frequency of the resonator in proportion to the number of the second set of shorting lines cut; and
   (f) measuring a new resonant frequency of the resonator.

17. A method for fine tuning a resonator according to claim 16, wherein steps c, d, e and f are automated. frequency is produced.

18. The method for fine tuning a resonator according to claim 16, wherein steps e and f are repeated until a desired resonant frequency is produced.

* * * * *